United States Patent
Kim et al.

(10) Patent No.: US 11,588,133 B2
(45) Date of Patent: Feb. 21, 2023

(54) ORGANIC LIGHT EMITTING DISPLAY APPARATUS

(71) Applicant: Samsung Display Co., Ltd., Yongin-si (KR)

(72) Inventors: Jongwoo Kim, Yongin-si (KR); Wonjong Kim, Yongin-si (KR); Yisu Kim, Yongin-si (KR); Changyeong Song, Yongin-si (KR); Hyein Yang, Yongin-si (KR); Woosuk Jung, Yongin-si (KR); Yongchan Ju, Yongin-si (KR); Jaeheung Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 34 days.

(21) Appl. No.: 16/905,285

(22) Filed: Jun. 18, 2020

(65) Prior Publication Data
US 2021/0175469 A1    Jun. 10, 2021

(30) Foreign Application Priority Data
Dec. 6, 2019    (KR) .................. 10-2019-0161670

(51) Int. Cl.
*H01L 51/52*    (2006.01)

(52) U.S. Cl.
CPC .... *H01L 51/5253* (2013.01); *H01L 2251/303* (2013.01)

(58) Field of Classification Search
CPC . H01L 2251/303; H01L 51/5253–5256; H01L 51/524–525
See application file for complete search history.

(56) References Cited

U.S. PATENT DOCUMENTS

| | | | |
|---|---|---|---|
| 6,888,305 B2 | 5/2005 | Weaver | |
| 10,312,473 B2 * | 6/2019 | Kim | H01L 27/3272 |
| 2016/0320885 A1 * | 11/2016 | Kim | G06F 3/0446 |
| 2018/0013100 A1 * | 1/2018 | Yim | H01L 51/5256 |
| 2018/0373085 A1 * | 12/2018 | Wilson | H01L 27/3225 |
| 2019/0393447 A1 | 12/2019 | Yun et al. | |

(Continued)

FOREIGN PATENT DOCUMENTS

| | | | | |
|---|---|---|---|---|
| JP | 2008-243379 A | 10/2008 | | |
| JP | 2008243379 | * 10/2008 | .......... | H01L 51/525 |
| JP | 5143996 B2 | 2/2013 | | |

(Continued)

OTHER PUBLICATIONS

Kawato JP2008243379-A, Oct. 9, 2008, English translation, pp. 1-24 (Year: 2008).*

*Primary Examiner* — Shaun M Campbell
(74) *Attorney, Agent, or Firm* — Lewis Roca Rothgerber Christie LLP

(57) ABSTRACT

An organic light-emitting display apparatus includes: a pixel electrode, an intermediate layer on the pixel electrode and including an emission layer, an opposite electrode on the pixel electrode such that the intermediate layer is therebetween, an inorganic encapsulation layer on the opposite electrode, an organic encapsulation layer on the inorganic encapsulation layer, and a protection layer on the organic encapsulation layer and including a first protection layer including silicon nitride and a second protection layer including silicon oxynitride.

8 Claims, 3 Drawing Sheets

(56) References Cited

U.S. PATENT DOCUMENTS

2020/0231495 A1* 7/2020 Lee .................. C03C 17/3657
2021/0359253 A1* 11/2021 Sun .................. H01L 51/56

FOREIGN PATENT DOCUMENTS

| KR | 10-1397108 B1 | 5/2014 |
| KR | 10-2015-0059667 A | 6/2015 |
| KR | 10-2018-0065060 A | 6/2018 |
| KR | 10-2019-0143556 A | 12/2019 |

* cited by examiner

ORGANIC LIGHT EMITTING DISPLAY APPARATUS

CROSS-REFERENCE TO RELATED APPLICATION

This application claims priority to and the benefit of Korean Patent Application No. 10-2019-0161670, filed on Dec. 6, 2019, in the Korean Intellectual Property Office, the entire disclosure of which is incorporated herein by reference.

BACKGROUND

1. Field

One or more embodiments relate to an organic light-emitting display apparatus, and more particularly, to an organic light-emitting display apparatus capable of increasing the life of an organic light-emitting element by preventing or reducing degradation of the organic light-emitting element.

2. Description of the Related Art

An organic light-emitting display apparatus includes an organic light-emitting element as a display element. The organic light-emitting element includes an intermediate layer, including an emission layer, between a pixel electrode and an opposite electrode. Because the intermediate layer is easily damaged by impurities from the outside, such as moisture and/or oxygen from the outside, it is important to protect the intermediate layer from impurities from the outside.

SUMMARY

However, such a related art organic light-emitting display apparatus has a problem in that it does not provide a long life of the organic light-emitting element, even though it reduces the influence of impurities from the outside.

An aspect of one or more embodiments is directed toward an organic light-emitting display apparatus capable of increasing (e.g., lengthening) the life of an organic light-emitting element by preventing or reducing degradation of the organic light-emitting element. However, this is merely an example, and the scope of the present disclosure is not limited to this aspect.

Additional aspects will be set forth in part in the description which follows and, in part, will be apparent from the description, or may be learned by practice of the disclosed embodiments of the present disclosure.

According to one or more embodiments, an organic light-emitting display apparatus includes a pixel electrode, an intermediate layer on the pixel electrode and including an emission layer, an opposite electrode on the pixel electrode such that the intermediate layer is therebetween, an inorganic encapsulation layer on the opposite electrode, an organic encapsulation layer on the inorganic encapsulation layer, and a protection layer on the organic encapsulation layer and including a first protection layer including silicon nitride and a second protection layer including silicon oxynitride.

The second protection layer may be on the first protection layer such that the first protection layer may be closer to the organic encapsulation layer than the second protection layer is.

The protection layer may include a plurality of pairs of the first protection layer and the second protection layer.

The first protection layer of any one pair in the protection layer may be closer to the organic encapsulation layer than the second protection layer of the one pair is.

The protection layer may include five or more and seven or less pairs of the first protection layer and the second protection layer.

The organic light-emitting display apparatus may further include an additional protection layer on the protection layer and including silicon nitride.

A refractive index of the first protection layer may be greater than that of the second protection layer.

The refractive index of the first protection layer may be 1.79 or more and 2.10 or less, and the refractive index of the second protection layer may be 1.62 or more and 1.70 or less.

A difference between the refractive index of the first protection layer and the refractive index of the second protection layer may be 0.09 or more and 0.48 or less.

A thickness of the first protection layer may be 350 Å or more and 500 Å or less, and a thickness of the second protection layer may be 600 Å or more and 700 Å or less.

These and/or other aspects will become apparent and more readily appreciated from the following description of the disclosed embodiments, taken in conjunction with the accompanying drawings.

BRIEF DESCRIPTION OF THE DRAWINGS

The above and other aspects and features of embodiments of the present disclosure will become more apparent from the following description taken in conjunction with the accompanying drawings, in which.

DETAILED DESCRIPTION

Figure 1:
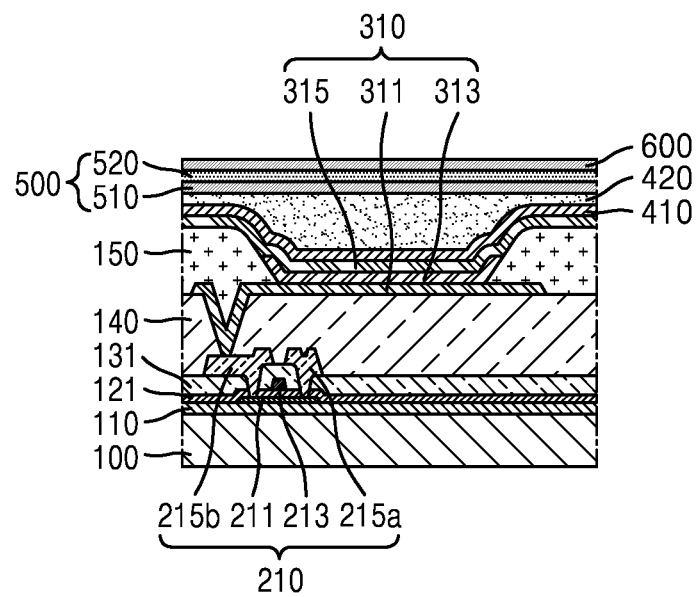
FIG. 1 is a partial cross-sectional view of an organic light-emitting display device according to an embodiment.

Reference will now be made in more detail to some embodiments of the present disclosure, examples of which are illustrated in the accompanying drawings, wherein like reference numerals refer to like elements throughout. In this regard, the disclosed embodiments may have different forms and should not be construed as being limited to the descriptions set forth herein. Accordingly, the disclosed embodiments are described below, by referring to the figures, to explain aspects and features of the present disclosure. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. As used herein, the use of "may" when describing embodiments of the inventive concept refers to "one or more embodiments of the present disclosure."

Because the subject matter of the present disclosure may have diverse modified embodiments, some embodiments are illustrated in the drawings and are described in the detailed description. Aspects and features of the present disclosure, and a method of accomplishing these, will be apparent when referring to embodiments described with reference to the drawings. The subject matter of the present disclosure may, however, be embodied in many different forms and should not be construed as limited to the embodiments disclosed herein.

Reference will now be made to some embodiments, examples of which are illustrated in the accompanying drawings, wherein like reference numerals refer to like elements throughout, and repeated description thereof may not be provided again.

It will be understood that when a layer, region, or component is referred to as being "on" another layer, region, or component, it can be directly or indirectly on the other layer, region, or component. For example, intervening layer(s), region(s), or component(s) may be present. In contrast, when a layer, region, or component is referred to as being "directly on" another layer, region, or component, there are no intervening layers, regions, or components. Sizes of components in the drawings may be exaggerated for convenience of explanation. For example, sizes and/or thicknesses of components in the drawings may be exaggerated for convenience of explanation, and the embodiments of the present disclosure are not limited thereto.

Furthermore, an x-axis, a y-axis, and a z-axis are not limited to three axes on an orthogonal coordinate system and may be widely understood. For example, the x-axis, the y-axis, and the z-axis may be perpendicular to one another or may represent different directions that are not perpendicular to one another.

FIG. 1 is a partial cross-sectional view of an organic light-emitting display device according to an embodiment.

The organic light-emitting display device according to the embodiment includes an organic light-emitting element 310 on a substrate 100. Various suitable electronic elements, including a thin-film transistor 210, may be provided on the substrate 100 and may be electrically connected (e.g., indirectly electrically connected) to the organic light-emitting element 310. In some embodiments, the organic light-emitting element 310 is electrically connected to the thin-film transistor 210 by a pixel electrode 311 of the organic light-emitting element 310 that is electrically connected to the thin-film transistor 210. For example, the pixel electrode 311 may be electrically connected to the thin-film transistor 210 to electrically connect the thin-film transistor 210 to the organic light-emitting element 310.

The substrate 100 may include (e.g., be) glass, metal, and/or a polymer resin. When the substrate 100 is flexible and/or bendable, the substrate 100 may include (e.g., be), for example, a polymer resin such as polyethersulphone, polyacrylate, polyetherimide, polyethylene naphthalate, polyethylene terephthalate, polyphenylene sulfide, polyarylate, polyimide, polycarbonate, and/or cellulose acetate propionate. Also, the substrate 100 may have a multilayer structure including two layers including the polymer resin, and a barrier layer including (e.g., being) an inorganic material (such as silicon oxide, silicon nitride, and/or silicon oxynitride, etc.) between the two layers, and various suitable modifications thereof are possible. For example, the substrate 100 may include at least two layers, each of the two layers including (e.g., being) one or more of the above-listed polymer resins, and a barrier layer between the two layers and including (e.g., being) an inorganic material, such as silicon oxide, silicon nitride, silicon oxynitride, and/or the like.

The thin-film transistor 210 may include a semiconductor layer 211, a gate electrode 213, a source electrode 215a, and a drain electrode 215b, the semiconductor layer 211 including (e.g., being) amorphous silicon, polycrystalline silicon, and/or an organic semiconductor material. The gate electrode 213 may include (e.g., be) various suitable conductive materials and may have various suitable layer structures. For example, the gate electrode 213 may include (e.g., be) a Molybdenum (Mo) layer and an Aluminum (Al) layer. The source electrode 215a and the drain electrode 215b may also include (e.g., be) various suitable conductive materials and may have various suitable layer structures, for example, a Titanium (Ti) layer and an Al layer.

Moreover, a gate insulating layer 121 may be between the semiconductor layer 211 and the gate electrode 213 to insulate the semiconductor layer 211 from the gate electrode 213, the gate insulating layer 121 including (e.g., being) an inorganic material such as silicon oxide, silicon nitride, and/or silicon oxynitride. An interlayer insulating layer 131 may be on the gate electrode 213, the interlayer insulating layer 131 including (e.g., being) an inorganic material such as silicon oxide, silicon nitride, and/or silicon oxynitride. The source electrode 215a and the drain electrode 215b may be on the interlayer insulating layer 131. An insulating layer including (e.g., being) an inorganic material may be formed by chemical vapor deposition (CVD) or atomic layer deposition (ALD). For example, the interlayer insulating layer 131 and/or the gate insulating layer 121 may be formed by CVD or ALD. This also applies to the following embodiments and variations thereof.

A buffer layer 110 may be between the thin-film transistor 210 and the substrate 100 having such a structure (e.g., the thin-film transistor 210 and the substrate 100 each having a structure as respectively described above), the buffer layer 110 including (e.g., being) an inorganic material such as silicon oxide, silicon nitride, and/or silicon oxynitride. The buffer layer 110 may increase smoothness of an upper surface of the substrate 100 and/or may prevent, minimize, or block impurities from the substrate 100 and/or the like from penetrating into the semiconductor layer 211 of the thin-film transistor 210.

A planarization layer 140 may be formed on (e.g., above) the thin-film transistor 210. For example, as shown in FIG. 1, when an organic light-emitting element 310 is on the thin-film transistor 210, the planarization layer 140 may generally flatten an upper portion of a protective film covering the thin-film transistor 210. The planarization layer 140 may include (e.g., be) an organic material such as acryl, benzocyclobutene (BCB), and/or hexamethyldisiloxane (HMDSO). Although the planarization layer 140 is shown as a monolayer in FIG. 1, the planarization layer 140 may be a multilayer and various suitable modifications are possible. A protective film including (e.g., being) an inorganic material may be between the thin-film transistor 210 and the planarization layer 140.

The organic light-emitting element 310 may be on the planarization layer 140. The organic light-emitting element 310 may include the pixel electrode 311, an opposite electrode 315, and an intermediate layer 313 therebetween, the intermediate layer 313 including an emission layer. As shown in FIG. 1, the pixel electrode 311 is electrically connected to the thin-film transistor 210 by contacting (e.g., directly or physically contacting) any one of the source electrode 215a and the drain electrode 215b through an opening formed in the planarization layer 140 and/or the like.

A pixel-defining layer 150 may be formed on the planarization layer 140. The pixel-defining layer 150 defines pixels by having an opening corresponding to each of sub-pixels or pixels, for example, an opening exposing at least a center (e.g., a center portion) of the pixel electrode 311. Furthermore, as shown in FIG. 1, the pixel-defining layer 150 may prevent or reduce the occurrence of generation of an arc and/or the like at the edge of the pixel electrode 311 by increasing a distance between the edge of the pixel electrode 311 and the opposite electrode 315 on (e.g., over) the pixel electrode 311. The pixel-defining layer 150 may include (e.g., be) an organic material such as polyimide and/or HMDSO.

The intermediate layer 313 of the organic light-emitting element (or organic light-emitting diode (OLED)) 310 may include (e.g., be) a low molecular weight material or a high molecular weight material. When the intermediate layer 313 includes (e.g., is) a low-molecular weight material, the intermediate layer 313 may have a single (e.g., single layer) or composite (e.g., multi-layer) structure by stacking a hole injection layer (HIL), a hole transport layer (HTL), an emission layer (EML), an electron transport layer (ETL), and/or an electron injection layer (EIL), and may be formed by a vacuum deposition method. When the intermediate layer 313 includes (e.g., is) a high molecular weight material, for example, a polymer material, the intermediate layer 313 may have a structure including a HTL and/or an EML. The HTL may include (e.g., be) PEDOT, and the EML may include (e.g., be) a polymer material such as poly-phenylenevinylene (PPV) and/or polyfluorene. The intermediate layer 313 may be formed by utilizing a screen printing method, an ink jet printing method, or a laser induced thermal imaging (LITI) method.

The intermediate layer 313 is not limited thereto, and may have various suitable structures. Also, the intermediate layer 313 may include an integral layer (e.g., a common layer) over multiple (e.g., all) of the plurality of pixel electrodes 311 and/or may include layers patterned to correspond to each of the pixel electrodes 311. For example, the EML may be a layer patterned to correspond to each of the plurality of pixel electrodes 311, and the HTL may be an integral layer (e.g., a common layer) on (e.g., over) the plurality of pixel electrodes 311.

The opposite electrode 315 on the intermediate layer 313 may cover, for example, a display area. In some embodiments, the opposite electrode 315 may be integrally formed throughout the plurality of organic light-emitting elements 310 to correspond to the plurality of pixel electrodes 311. For example, the opposite electrode 315 may be common to multiple (e.g., all) of the plurality of organic light-emitting elements 310.

The opposite electrode 315 may cover the display area and extend to (e.g., extend up to or into) a peripheral area outside (e.g., adjacent to) the display area. Because an electrode power supply line may be in the peripheral area, the opposite electrode 315 may be electrically connected to the electrode power supply line in the peripheral area. This electrode power supply line is also called ELVSS.

Because the organic light-emitting element 310 is easily damaged by moisture and/or oxygen from the outside, an encapsulation layer may be on (e.g., may cover) and protect the organic light-emitting element 310. The encapsulation layer covers the display area and may extend to (e.g., extend up to or into) at least a portion of the peripheral area. The encapsulation layer may include an inorganic encapsulation layer 410 and an organic encapsulation layer 420 as shown in FIG. 1. The inorganic encapsulation layer 410 is on the opposite electrode 315 and may cover the display area and extend to (e.g., extend up to or into) at least a portion of the peripheral area. The inorganic encapsulation layer 410 may include (e.g., be) silicon oxide, silicon nitride, and/or silicon oxynitride. The organic encapsulation layer 420 is on the inorganic encapsulation layer 410. The organic encapsulation layer 420 may include (e.g., be) an acrylic material and/or a silicon-based organic material. In the case of the acrylic material, the organic encapsulation layer 420 may include (e.g., be) polyacrylate. In the case of the silicon-based organic material, the organic encapsulation layer 420 may include (e.g., be) curable polydimethylsiloxane, acrylic polymethylsiloxane, and/or epoxy polymethylsiloxane.

The organic light-emitting display device according to the embodiment further includes a protection layer 500 on the organic encapsulation layer 420. The protection layer 500 includes a first protection layer 510 including (e.g., being) silicon nitride and a second protection layer 520 including (e.g., being) silicon oxynitride. As shown in FIG. 1, the second protection layer 520 is on the first protection layer 510, and the first protection layer 510 is located closer to the organic encapsulation layer 420 than the second protection layer 520. For example, the first protection layer 510 may be between the organic encapsulation layer 420 and the second protection layer 520.

In the organic light-emitting display device according to the embodiment, because the structure of the inorganic encapsulation layer 410, the organic encapsulation layer 420, and the protection layer 500 is a structure of an inorganic film/organic film/inorganic film (e.g., a structure including two inorganic films with an organic film therebetween), impurities such as oxygen and/or moisture from the outside may be effectively prevented or blocked from penetrating into the organic light-emitting element 310. For example, because the structure of the inorganic encapsulation layer 410, the organic encapsulation layer 420, and the protection layer 500 is a structure of the inorganic film/ organic film/inorganic film, the penetration of air and/or moisture may be prevented or blocked, or the penetration path (e.g., the path that air and/or moisture traverses, or must traverse, before reaching the intermediate layer 313) may be lengthened to make it difficult for air and/or moisture to reach the intermediate layer 313.

The inorganic film prevents or blocks the penetration of moisture and/or air, but when particles (e.g., foreign particles and/or impurities) are present in a manufacturing process, pinholes are formed by the particles in the inorganic film due to the characteristics of the inorganic film, and air and/or moisture may penetrate through the pinholes. In the case of the organic film, air and/or moisture may penetrate because the organic film is a coarse layer. However, the organic film may be flattened around particles on the inorganic film under the organic film, thereby forming (e.g., allowing the formation of) an inorganic film having no pinholes or a minimal or reduced number of pinholes when forming the inorganic film on the organic film. Moreover, even though pinholes are formed in the inorganic film formed on the organic film, the pinholes are not directly connected to the pinholes formed in the inorganic film under the organic film. Accordingly, a penetration path, for example, of air and/or moisture may be lengthened so that air and/or moisture cannot easily reach the intermediate layer 313.

Moreover, a refractive index of the first protection layer 510 may be greater than a refractive index of the second protection layer 520. As described above, the first protection layer 510 includes silicon nitride. Because $SiH_4$, $N_2$, $H_2$, $NH_3$, and/or $N_2O$ may be used to form the first protection layer 510 including silicon nitride by a CVD method, a refractive index of a layer including silicon nitride may be adjusted by adjusting the amount of $SiH_4$. In more detail, when the first protection layer 510 is formed, the refractive index of the first protection layer 510 may be increased by increasing the amount of $SiH_4$. Because the $SiH_4$, $N_2$, $H_2$, $NH_3$, and/or $N_2O$ may be used to form the second protection layer 520 including silicon oxynitride by a CVD method, a refractive index of a layer including silicon oxynitride may be adjusted by adjusting the amount of $N_2O$. In more detail, when the second protection layer 520 is formed, the refractive index of the second protection layer 520 may be lowered by increasing the amount of $N_2O$.

As shown in FIG. 1, the organic light-emitting display device may further include an additional protection layer 600 on the protection layer 500, the additional protection layer 600 including silicon nitride. Like the first protection layer 510, the additional protection layer 600 may have a refractive index greater than that of the second protection layer 520.

In the case of the organic light-emitting display device according to the embodiment, the protection layer 500 and the additional protection layer 600 may form an organic-inorganic composite film together with the inorganic encapsulation layer 410 and the organic encapsulation layer 420, thereby effectively protecting the organic light-emitting element 310 from impurities from the outside. Furthermore, the protection layer 500 and the additional protection layer 600 form high refractive index layer/low refractive index layer/high refractive index layer (e.g., a structure including two layers with a third layer therebetween, the third layer having a refractive index less than both of the two layers), thereby shielding or blocking a large portion of ultraviolet rays of the light incident toward the organic light-emitting element 310 from the outside. Accordingly, deterioration the organic light-emitting element 310 by ultraviolet rays may be effectively prevented, minimized, or reduced.

Figure 2:
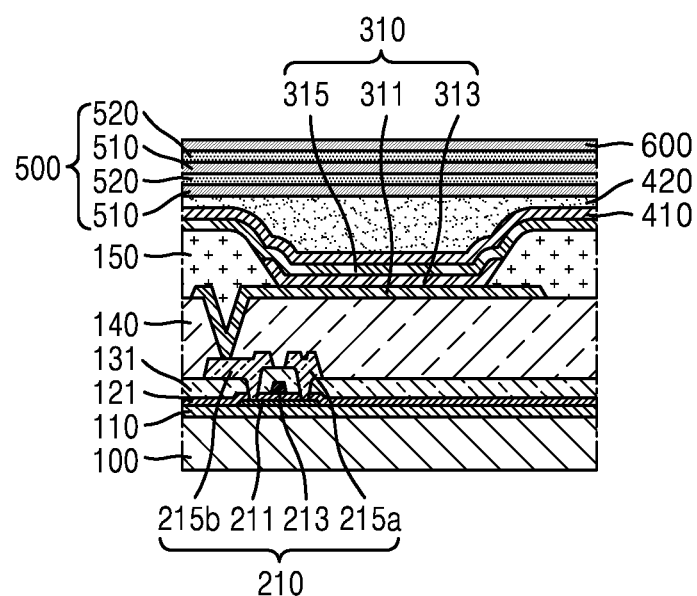
FIG. 2 is a partial cross-sectional view of an organic light-emitting display device according to another embodiment.

In FIG. 1, the protection layer 500 includes one pair of the first protection layer 510 and the second protection layer 520, but the disclosure is not limited thereto. As shown in FIG. 2, which is a cross-sectional view schematically showing a portion of an organic light-emitting display device according to another embodiment, the protection layer 500 may include a plurality of pairs of the first protection layer 510 and the second protection layer 520, such as two pairs of the first protection layer 510 and the second protection layer 520. In this case, a first protection layer 510 of any one pair provided in the protection layer 500 may be on a second protection layer 520 of a pair below the one pair. In some embodiments, the first protection layers 510 and the second protection layers 520 may be alternately arranged, beginning with one of the first protection layers 510, on (e.g., on top of) the organic encapsulation layer 420. For example, the first protection layer 510 of any one pair may be between the organic encapsulation layer 420 and the second protection layer 520 of the one pair. In this way, the protection layer 500 and the additional protection layer 600 form a composite film of high refractive index layer/low refractive index layer/high refractive index layer/low refractive index layer/high refractive index layer, thereby effectively shielding or blocking a large portion of ultraviolet rays of the light incident toward the organic light-emitting element 310 from the outside.

In FIG. 2, the protection layer 500 includes two pairs of the first protection layer 510 and the second protection layer 520, but the disclosure is not limited thereto. The protection layer 500 may include five or more pairs and seven or less pairs of the first protection layer 510 and the second protection layer 520, preferably seven pairs.

Figure 3:
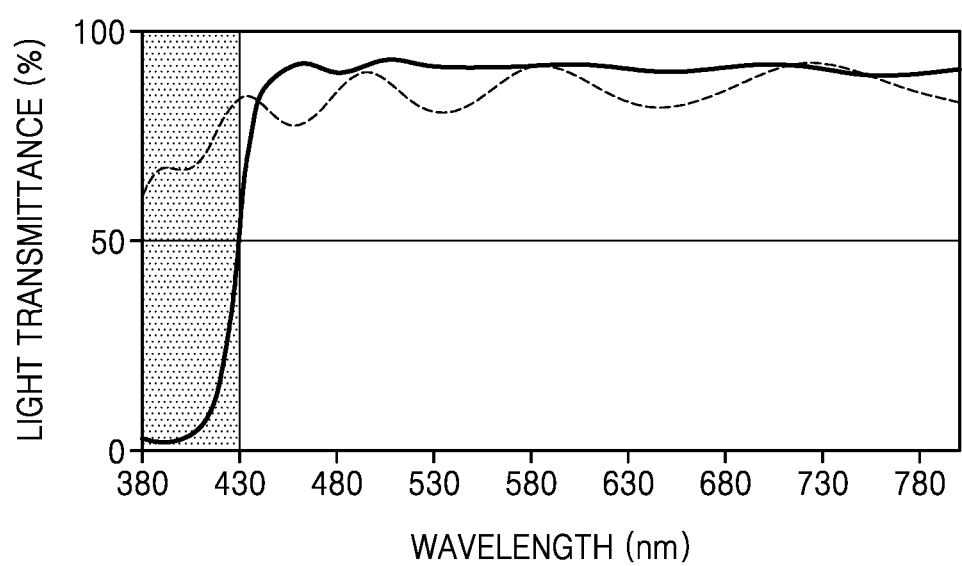
FIG. 3 is a graph showing light transmittance according to a wavelength of light in a protection layer and an additional protection layer of an organic light-emitting display device according to another embodiment, and also showing light transmittance according to a wavelength of light in an upper layer of an organic light-emitting display device according to a comparative example.

FIG. 3 is a graph showing light transmittance according to a wavelength of light in the protection layer 500 and the additional protection layer 600 of an organic light-emitting display device according to an embodiment, and also showing light transmittance according to a wavelength of light in an upper layer of an organic light-emitting display device according to a comparative example. The protection layer 500 of the organic light-emitting display device according to the present embodiment, the transmittance results of which are shown in FIG. 3, includes seven pairs of the first protection layer 510 and the second protection layer 520. An organic light-emitting display device according to a comparative example includes an organic light-emitting element and an upper layer on the organic light-emitting element, the organic light emitting element including a pixel electrode, an opposite electrode, and an intermediate layer therebetween, the intermediate layer including an emission layer. The upper layer of the organic light-emitting display device according to the comparative example has a structure in which an organic encapsulation layer and an inorganic encapsulation layer are alternately stacked.

For ultraviolet rays having a wavelength of 430 nm or less, in the case of the organic light-emitting display device according to the comparative example shown by dashed lines in FIG. 3, a considerable amount of ultraviolet rays pass through the upper layer to reach the organic light-emitting element although the transmittance is lowered. As a result, the organic light-emitting element may deteriorate. However, in the case of the organic light-emitting display device according to an embodiment shown by the solid line in FIG. 3, it can be seen that ultraviolet rays having a wavelength of 430 nm or less are mostly shielded or blocked by the protection layer 500 and the additional protection layer 600. Accordingly, deterioration of the organic light-emitting element by ultraviolet rays may be effectively prevented, minimized, or reduced, thereby lengthening the life of the organic light-emitting display device. As used herein, the term nm refers to a unit of distance equal to $10^{-9}$ meters.

In such an organic light-emitting display device, a refractive index of the first protection layer 510 may be 1.79 or more and 2.10 or less (e.g., within a range of 1.79 to 2.10), and a refractive index of the second protection layer 520 may be 1.62 or more and 1.70 or less (e.g., within a range of 1.62 to 1.70). Accordingly, a difference between the refractive index of the first protection layer 510 and the refractive index of the second protection layer 520 may be 0.09 or more and 0.48 or less (e.g., within a range of 0.09 to 0.48).

Figure 4:
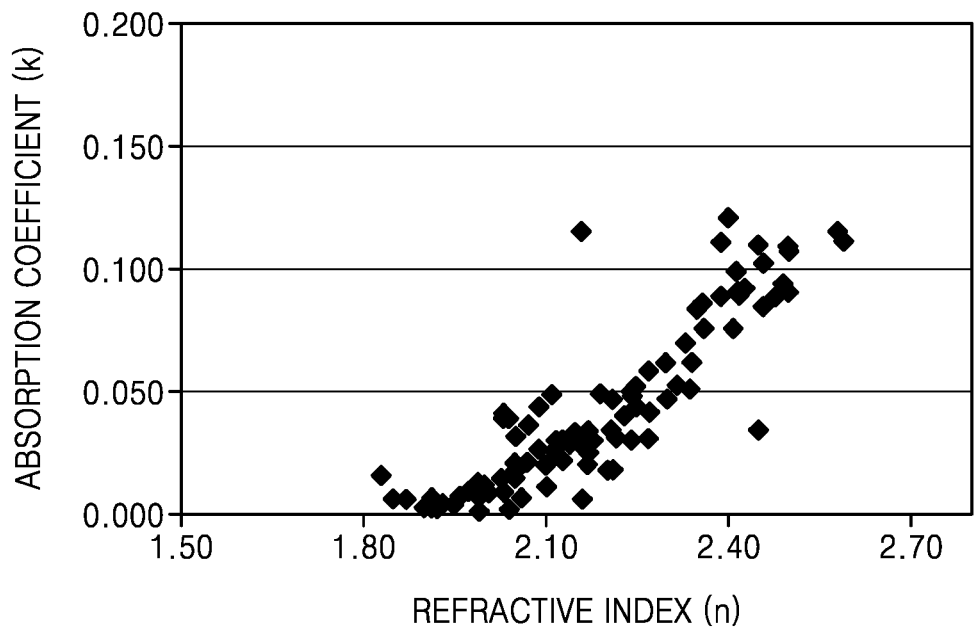
FIG. 4 is a graph showing an absorption coefficient according to refractive indices of a first protection layer and an additional protection layer of an organic light-emitting display device according to an embodiment.

FIG. 4 is a graph showing an absorption coefficient according to refractive indices of the first protection layer 510 and the additional protection layer 600 of the organic light-emitting display device according to an embodiment. That is, FIG. 4 is a graph schematically showing an absorption coefficient according to the refractive index of the first protection layer 510 and is also a graph schematically showing an absorption coefficient according to the refractive index of the additional protection layer 600. As shown in FIG. 4, in each of the first protection layer 510 and the additional protection layer 600, the absorption coefficient rapidly increases when the refractive index exceeds 2.10. As the absorption coefficient is increased, transmittance of light is lowered, so that the ratio of extraction of light generated by the organic light-emitting element to the outside is lowered. For example, as the absorption coefficient is increased, the transmittance of light from within the display device to the outside is lowered. This results in a problem that the luminance of the organic light-emitting display device is lowered. Therefore, the refractive indices of the first protection layer 510 and the additional protection layer 600 are preferably set to be 2.10 or less. As described above, because the first protection layer 510 and the additional protection layer 600 include silicon nitride, the lower limit of a refractive index of a film including silicon nitride containing no oxide is 1.79. Therefore, the refractive index of each of the first protection layer 510 and the additional protection layer 600 is preferably 1.79 or more and 2.10 or less.

Figure 5:
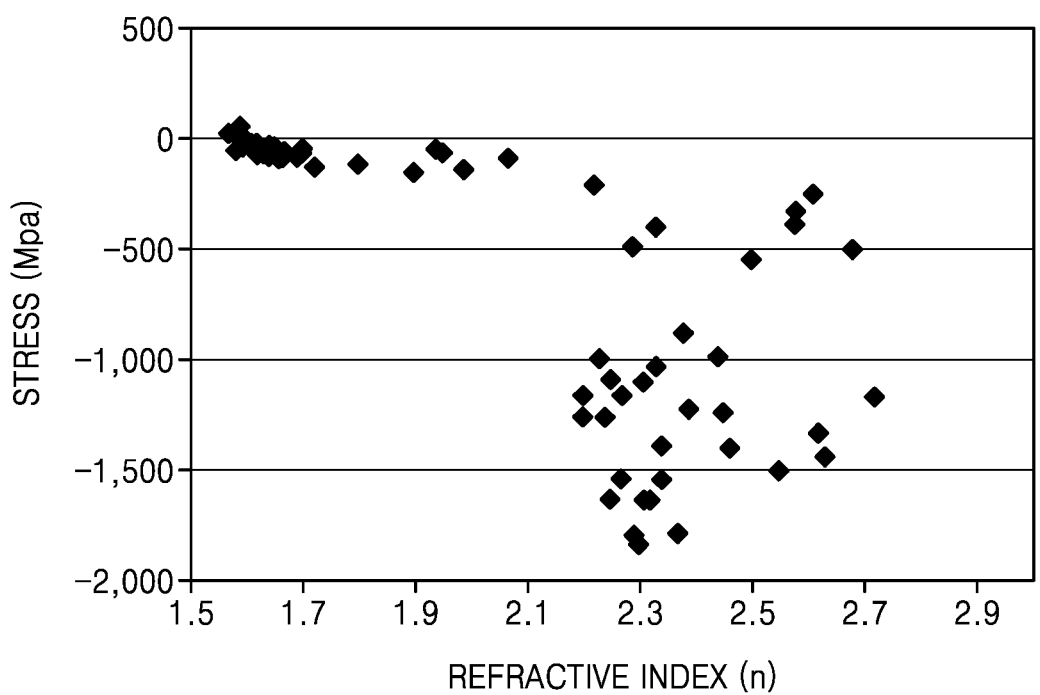
FIG. 5 is a graph showing compressive stress according to refractive indices of a first protection layer and an additional protection layer of an organic light-emitting display device according to an embodiment.

FIG. 5 is a graph showing compressive stress according to refractive indices of the first protection layer 510 and the additional protection layer 600 of the organic light-emitting display device according to an embodiment. As shown in FIG. 5, when the refractive index exceeds 2.10, compressive stress increases rapidly (measured in negative values). When the compressive stress increases, a problem arises in that a multilayer thin film in the protection layer 500 is easily peeled off. Therefore, the refractive indices of the first protection layer 510 and the additional protection layer 600 are preferably set to 2.10 or less. For this reason, the refractive index of each of the first protection layer 510 and the additional protection layer 600 is preferably 1.79 or more and 2.10 or less.

For reference, a brief description of a method of measuring compressive stress is as follows. First, the curvature of a surface of a reference wafer is measured by irradiating a laser beam on the surface of the reference wafer. Then, after forming a thin film to be measured for compressive stress on the surface of the reference wafer, the curvature of the surface of the reference wafer is measured again by irradiating a laser beam. A difference occurs between the curvature measured first and the curvature measured later, because the surface of the reference wafer is deformed by the compressive stress of the formed thin film. In this way, the two curvature measurements and a thickness of the thin film to be measured for compressive stress may be entered into Stoney's equation to find compressive stress of the thin film to be measured.

On the other hand, when the refractive index of the second protection layer 520 is less than 1.62, it can be seen that after a certain time elapses, for example, after 240 hours, the second protection layer 520 is easily oxidized. Therefore, the refractive index of the second protection layer 520 is preferably set to 1.62 or more. For an ultraviolet shielding effect, because the refractive index of the second protection layer 520 is preferably less than the refractive index of the first protection layer 510, the refractive index of the second protection layer 520 is preferably 1.70 or less.

The following table shows a result of, after forming a silicon oxynitride thin film, measuring a composition ratio of the thin film before being placed in a high temperature and high humidity environment and a component ratio of the thin film after being placed in the high temperature and high humidity environment for 500 hours utilizing an X-ray photoelectron spectroscopy (XPS). The unit is percentage.

| refractive | before | | | after | | |
|---|---|---|---|---|---|---|
| index | Si (%) | O (%) | N (%) | Si (%) | O (%) | N (%) |
| 1.70 | 47.4 | 20.4 | 32.2 | 47.3 | 20.5 | 32.2 |
| 1.62 | 41.0 | 34.2 | 24.8 | 40.5 | 35.1 | 24.4 |
| 1.58 | 40.5 | 40.7 | 18.8 | 34.7 | 65.0 | 0.30 |

As can be seen from the above table, in the case of a thin film having a refractive index of 1.62 or 1.70, the change in the component ratio before and after being placed in the high temperature and high humidity environment is extremely small. However, when the refractive index is 1.58, it can be seen that the ratio of oxygen in the thin film after being placed in the high temperature and high humidity environment increases rapidly to 65.0% while the ratio of oxygen in the thin film before being placed in the high temperature and high humidity environment is 40.7%. Therefore, it can be seen that oxidation easily occurs when the refractive index of the second protection layer 520 is less than 1.62. Therefore, the refractive index of the second protection layer 520 is preferably 1.62 or more. In addition, as described above, for an ultraviolet shielding effect, because the refractive index of the second protection layer 520 is preferably less than the refractive index of the first protection layer 510, the refractive index of the second protection layer 520 is preferably 1.70 or less. Therefore, as a result, the refractive index of the second protection layer 520 is preferably 1.62 or more and 1.70 or less.

A thickness of each of the first protection layer 510 and the additional protection layer 600 may be 350 Å or more and 500 Å or less (e.g., within a range of 350 Å to 500 Å), and a thickness of the second protection layer 520 may be 600 Å or more and 700 Å or less (e.g., within a range of 600 Å to 700 Å). As used herein, the term A refers to a unit of distance equal to $10^{-10}$ meters. This may increase, improve, or maximize a UV shielding and/or reflection effect.

Moreover, as described above, the protection layer 500 includes the first protection layer 510 including silicon nitride and the second protection layer 520 including silicon oxynitride. In addition, the additional protection layer 600, which is on the outermost (e.g., uppermost) second protection layer 520 of the protection layer 500, includes silicon nitride. A refractive index of each of the first protection layer 510 and the additional protection layer 600 is relatively higher than that of the second protection layer 520. Because silicon oxide cannot be formed of (e.g., formed into) an inorganic film having a high refractive index, the first protection layer 510 and the additional protection layer 600 include silicon nitride rather than silicon oxide. In addition, because silicon oxide does not have a barrier property that prevents or blocks impurities such as oxygen and/or moisture from penetrating into the organic light-emitting element 310, silicon oxide cannot be used as a layer having a low refractive index (e.g., silicon oxide cannot be used as a layer having both a low refractive index and a barrier property). Therefore, the second protection layer 520 having a low refractive index includes silicon oxynitride rather than silicon oxide.

According to an embodiment as described above, an organic light-emitting display apparatus capable of increasing (e.g., lengthening) the life of an organic light-emitting element by preventing or reducing degradation of the organic light-emitting element may be implemented. However, the scope of the disclosure is not limited to this aspect.

It should be understood that embodiments described herein should be considered in a descriptive sense only and not for purposes of limitation. Descriptions of features or aspects within each embodiment should generally be considered as available for other similar features or aspects in other embodiments. While some embodiments have been described herein with reference to the figures, it will be understood by those of ordinary skill in the art that various changes in form and details may be made therein without departing from the spirit and scope of the present disclosure as defined by the following claims and equivalents thereof.

What is claimed is:

1. An organic light-emitting display apparatus comprising:
    a pixel electrode;
    an intermediate layer on the pixel electrode, the intermediate layer comprising an emission layer;
    an opposite electrode on the pixel electrode such that the intermediate layer is therebetween;
    an inorganic encapsulation layer on the opposite electrode;
    an organic encapsulation layer on the inorganic encapsulation layer;
    a protection layer on the organic encapsulation layer, the protection layer comprising:
        a first protection layer on the organic encapsulation layer, comprising silicon nitride, and having a set refractive index; and
        a second protection layer on the first protection layer, comprising silicon oxynitride, and having a set refractive index; and
    another protection layer on the second protection layer, comprising silicon nitride, and having a set refractive index,
    wherein the set refractive index of the second protection layer is 1.62 or more,
    wherein the protection layer comprises a plurality of pairs of the first protection layer and the second protection layer,
    wherein, in each of the plurality of pairs of the first protection layer and the second protection layer, the first protection layer is closer to the organic encapsulation layer than the second protection layer is to the organic encapsulation layer, and
    wherein the another protection layer is the first protection layer of one of the plurality of pairs.

2. The organic light-emitting display apparatus of claim 1, wherein the first protection layer of any one pair of the plurality of pairs in the protection layer disposed on another pair of the plurality of pairs in the protection layer is on the second protection layer of the another pair below the one pair.

3. The organic light-emitting display apparatus of claim 1, wherein the protection layer comprises five or more and seven or less pairs of the first protection layer and the second protection layer.

4. The organic light-emitting display apparatus of claim 1, further comprising an additional protection layer on the protection layer, the additional protection layer comprising silicon nitride.

5. The organic light-emitting display apparatus of claim 1, wherein the set refractive index of the first protection layer is greater than the set refractive index of the second protection layer.

6. The organic light-emitting display apparatus of claim 5, wherein the set refractive index of the first protection layer is 1.79 or more and 2.10 or less, and the set refractive index of the second protection layer is 1.70 or less.

7. The organic light-emitting display apparatus of claim 5, wherein a difference between the set refractive index of the first protection layer and the set refractive index of the second protection layer is 0.09 or more and 0.48 or less.

8. The organic light-emitting display apparatus of claim 5, wherein a thickness of the first protection layer is 350 Å or more and 500 Å or less, and a thickness of the second protection layer is 600 Å or more and 700 Å or less.

* * * * *